United States Patent [19]

Tsuji

[11] Patent Number: 5,380,420
[45] Date of Patent: Jan. 10, 1995

[54] ARC ION PLATING SYSTEM

[75] Inventor: Kunihiko Tsuji, Takasago, Japan

[73] Assignee: Kabushiki Kaisha Kobe Seiko Sho, Kobe, Japan

[21] Appl. No.: 65,491

[22] Filed: May 24, 1993

[30] Foreign Application Priority Data

May 26, 1992 [JP] Japan .................................. 4-133843
Apr. 22, 1993 [JP] Japan .................................. 5-096166

[51] Int. Cl.⁶ ............................................. C23C 14/22
[52] U.S. Cl. ............................ 204/298.41; 204/298.05;
204/192.38; 204/298.23
[58] Field of Search ...................... 204/298.05, 298.06,
204/298.09, 298.08, 298.15, 298.23, 298.25,
298.28, 298.41, 192.38

[56] References Cited

U.S. PATENT DOCUMENTS

| | | | |
|---|---|---|---|
| 4,448,799 | 5/1984 | Bergmann et al. | 204/298.41 X |
| 4,877,505 | 10/1989 | Bergmann | 204/298.41 X |
| 4,894,133 | 1/1990 | Hedgcoth | 204/298.25 X |
| 4,975,168 | 12/1990 | Ohno et al. | 204/298.25 X |
| 5,026,466 | 6/1991 | Wesemeyer et al. | 204/298.41 X |
| 5,037,522 | 8/1991 | Vergason | 204/298.41 |
| 5,103,766 | 4/1992 | Yoshikawa et al. | 204/298.41 X |
| 5,244,554 | 9/1993 | Yamagata et al. | 204/298.25 X |

FOREIGN PATENT DOCUMENTS

1-136966  5/1989  Japan .
1-161257  11/1989  Japan .

Primary Examiner—Nam Nguyen
Attorney, Agent, or Firm—Oblon, Spivak, McClelland, Maier & Neustadt

[57] ABSTRACT

The present invention provides an arc ion plating system capable of easily moving a cathode and a workpiece in and out of a vacuum chamber for exchange, surface cleaning, and the like. A door is provided for opening/closing an opening portion provided on the vacuum chamber. A movable carrier that is movable in and out of the vacuum chamber through the opening portion is mounted. The cathode and the workpiece are provided on the movable carrier. The cathode and the workpiece that are mounted on the movable carrier are carried in and out of the vacuum chamber together with the movable carrier.

15 Claims, 8 Drawing Sheets

ARC ION PLATING SYSTEM

BACKGROUND OF THE INVENTION

1. Field of the Invention

The present invention relates to an arc ion plating system for coating workpieces with a material vaporized by an electrical means or its compound.

2. Description of the Prior Art

Figure 7:
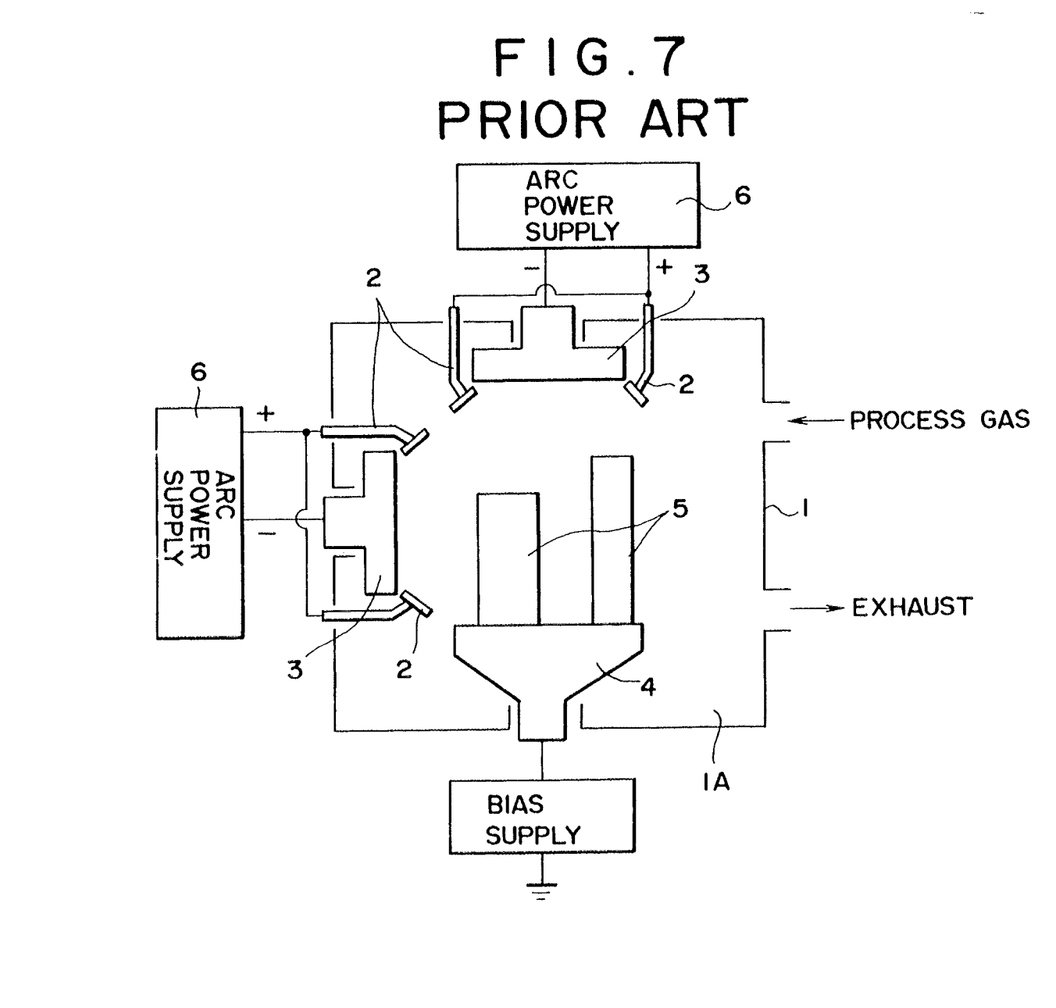
FIG. 7 is a view showing the construction of a prior art 1.
Figure 8:
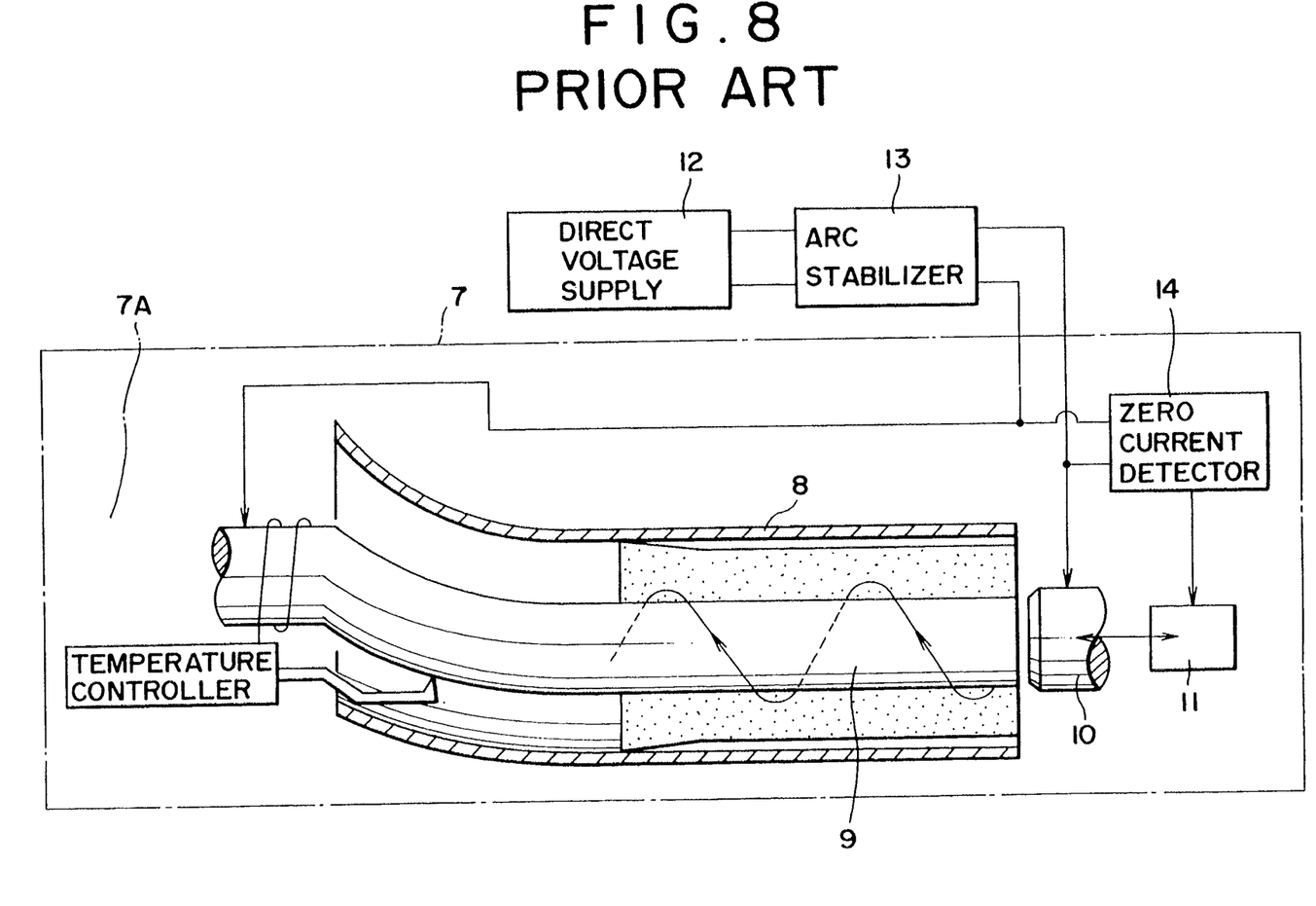
FIG. 8 is a view showing the construction of a prior art 2.

Conventionally, there have been known such arc ion plating systems as shown in FIGS. 7 and 8.

The system according to a prior art 1, as shown in FIG. 7, is of a conventional type. This has such a basic construction that anodes 2 and cathodes 3 are rigidly fixed within a vacuum chamber 1A of a vacuum vessel 1, and workpieces 5 to be mounted on a rotary table 4 are carried in and out of the vacuum chamber 1A. Also, arc power supplies 6 are usually connected to the cathodes 3 and anodes 2.

FIG. 8 shows the system according to a prior art, which is disclosed in Japanese Patent Laid-open No. sho 59-21574. This is of a type in which a bar-like cathode 9 is internally positioned at the center of a cylindrical workpiece 8 disposed within a vacuum chamber 7A in a vacuum vessel 7, and the cathode 9 and an anode 10 corresponding thereto are intermittently contacted with each other by driving of a reciprocating drive unit 11, so that a spiral current is applied around the cathode 9 to evaporate and ionize the cathode material.

In addition, in FIG. 8, numeral 12 indicates a direct voltage supply; 13 is an arc stabilizer; and 14 is a zero current detector.

SUMMARY OF THE INVENTION

An object of the present invention is to provide an arc ion plating system capable of easily carrying a cathode and a workpiece in and out of a vacuum chamber for the exchange, surface cleaning and the like.

In a preferred mode of the present invention, there is provided an arc ion plating system for forming thin films on the surface of a workpiece, comprising: a vacuum chamber in which a workpiece is disposed; a cathode whose component is evaporated to form thin films on the surface of the workpiece; an opening portion provided on the vacuum chamber; an opening/closing means for opening/closing the opening portion; and a moving means movable in and out of the vacuum chamber through the opening portion and mounting the workpiece and the cathode thereon.

In operation of the above system, the cathode and the workpiece are mounted on the moving means; the opening portion is opened by the opening/closing means, and the moving means is moved in the vacuum chamber through the opening portion; the opening portion is closed by the opening/closing means; thin films are formed on the surface of the workpiece; and the opening portion is opened by the opening/closing means, and the moving means is moved out of the vacuum chamber through the opening portion.

According to the present invention, there are provided a door for opening/closing the opening portion of a vacuum vessel; and a movable carrier freely moved in and out the vacuum chamber through the opening portion. Thus, the cathode and the workpiece are mounted on the movable carrier. Accordingly, it is possible to easily carry the cathode and workpiece in and out of the vacuum chamber together with the movable carrier in the state that they are mounted.

Accordingly, it is possible to easily carry the cathode and workpiece in and out of the vacuum chamber for the exchange between workpieces before and after the coating, between a consumed cathode and a new cathode, or between the cathodes of different kinds, the surface cleaning for the cathode and the like. Also, it is possible to easily change the cathode for each batch.

Further, by applying the present invention to an in-line system, the cathode and workpiece may be moved between a plurality of chambers by the movable carrier, which makes it possible to improve the working efficiency.

DESCRIPTION OF THE PREFERRED EMBODIMENTS

Hereinafter, embodiments of the present invention will be described with reference to the drawings.

Figure 1:
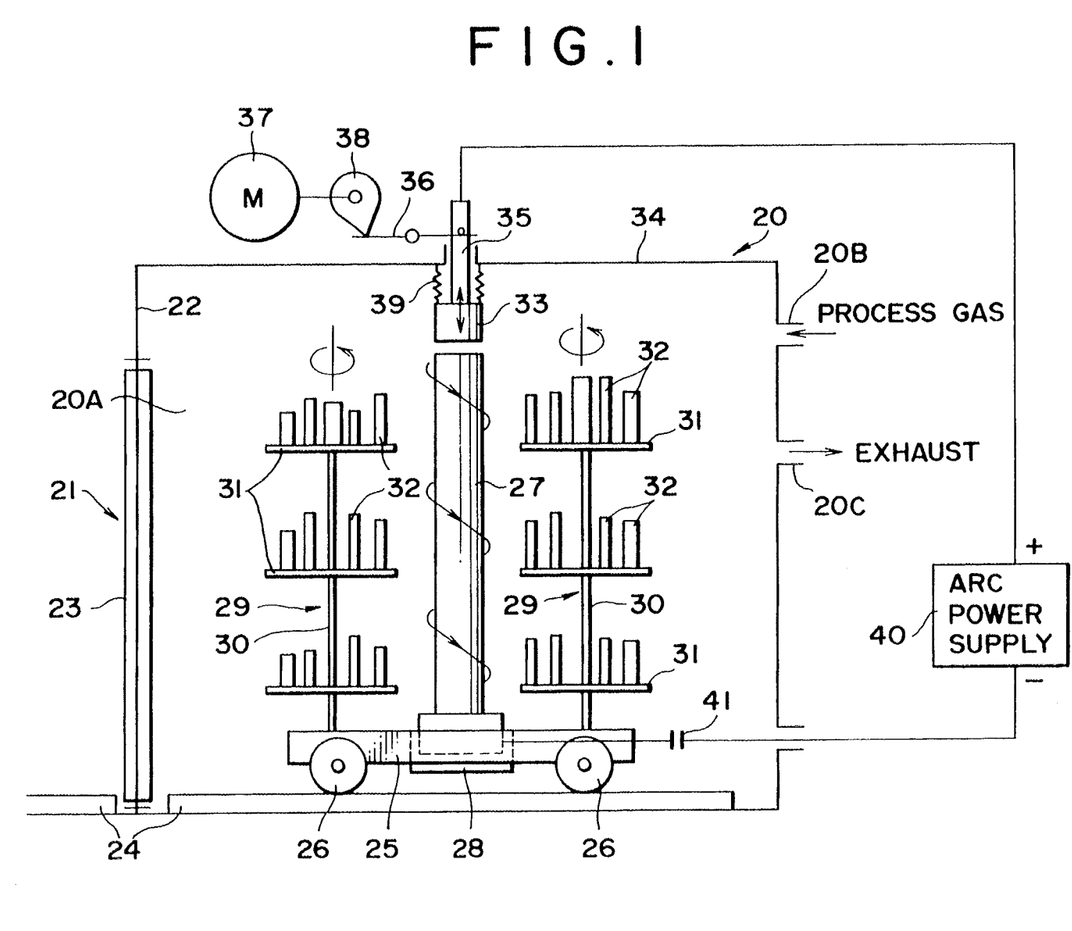
FIG. 1 is a schematic view showing the construction of a first embodiment of the present invention.

Referring to FIG. 1, there is shown a first embodiment of the present invention, wherein an opening portion 21 is formed on one side wall 22 of a vacuum vessel defining a vacuum chamber 20A therein. The opening portion 21 is freely opened and closed by means of a door 23.

Rails 24 are laid on a floor surface inside and outside the vacuum chamber 20A through the opening portion 21. A movable carrier 25 having wheels 26 rolling on the rails 24 is freely moved in and out of the vacuum chamber 20A through the opening portion 21 along the rails 24.

A bar-like cathode 27 for a target is vertically erected at the central portion on the movable carrier 25 and is insulated from the movable carrier 25 by an electrically insulating material 28 in such a manner as to be removable by means of a fixing means (not shown).

A plurality of rotary tables 29 are provided on the movable carrier 25 in such a manner as to be disposed around the cathode 27 at equal intervals. Each of the rotary tables 29 is constituted of a rotary shaft 30 vertically mounted on the movable carrier 25, and a plurality of vertically stepped receiving plates 31 fixed on the rotary shaft 30. Workpieces 32 are mounted on each of the receiving plates 31.

In addition, as a driving means for driving the rotary shaft 30, there may be considered the methods of; rotating the rotary shaft 30 around its axis by a rotating motor provided on the movable carrier 25; and providing a clutch to be connected when the movable carrier 25 is moved in the vacuum chamber and is positioned at a specified point, thereby rotating the rotary shaft 30 by a rotational motor or the like that is disposed outside the vacuum chamber 20A.

An introducing port 20B for a process gas and an exhaust port 20C for vacuum degassing are formed on the back wall of the vacuum vessel 20.

An anode 33 is vertically slidably mounted on a ceiling portion 34 so as to be positioned directly over the cathode 27 in order to eliminate the obstruction of the anode 33 against the movement of the movable carrier 25 mounting the cathode 27 and the workpieces 32 in and out of the vacuum chamber 20A, or to intermittently contact the anode 33 with the cathode 27 when the movable carrier 25 is stopped at a specified position of the vacuum chamber 20A.

A vertically sliding means for the anode 33 is constituted of an oscillating link 36 connected to a shaft portion 35 of the anode 33, a cam 38 for vertically oscillating the oscillating link 36, and a motor 37 as a drive source. The vertically sliding means may be constituted of an expansion type cylinder and the like. In the embodiment as shown in the figure, the anode 33 mounted on the ceiling portion 34 through a sealing bellows 9 is linearly moved in the vertical direction by the sliding guide of the shaft portion 35 by means of the motor 37, cam 38 and the oscillating link 36, to be thus intermittently contacted with the cathode 27.

An arc power supply 40 is provided outside the vacuum chamber 20A, wherein the positive terminal is connected to the anode 33 through the shaft portion 35, and the negative terminal is connected to the base portion of the cathode 27 through a contact 41.

in the above construction, the cathode 27 is erected on the movable carrier 25 outside the vacuum chamber 20A, and a specified workpieces 32 are mounted on each rotary table 29. The movable carrier 25 is then moved in the vacuum chamber 20A at a specified position along the rails 24 through the opening portion 21, so that the cathode 27 is positioned under the anode 33, thus making it possible to perform the intermittent contact therebetween. On the other hand, the cathode 27 side is connected to the contact 41.

After that, the door 23 is closed, and the chamber 20A is evacuated by a vacuum pump (not shown) or the like through the exhaust port 20C. Then, the motor 37 is started to be operated, to vertically move the anode 33 through the cam 38, oscillating link 36 and the shaft portion 35, so that the anode 33 is intermittently contacted with the cathode 27. Thus, a spiral current is applied around the cathode 27, to evaporate and ionize the cathode, thus making it possible to coat the workpieces 32 on each rotary table 29. Also, by evacuating the vacuum chamber 20A and introducing a process gas therein through the introducing port 20B, it is possible to coat the surfaces of the workpieces 32 with a compound containing the component of the cathode 27 and the component of the process gas. For example, by using Ti as the material of the cathode 27 and introducing $N_2$ as the process gas, it is possible to coat the surfaces of the workpieces 32 with TiN. Similarly, various kinds of thin films may be coated by the assembly of the cathode 27 and the process gas. Further, by rotation of the rotary table 29 in the coating operation, it is possible to uniformly and homogeneously coat the whole workpieces 32. After completion of the coating, the door 23 is opened, and the movable carrier 25 is removed to the outside through the opening portion 21.

With this construction, it is possible to carry the workpieces 32 and the cathode 27 in and out of the vacuum chamber 20A together with the movable carrier 25 in the state that they are mounted thereon, and hence to easily and rapidly carry the workpieces 32 and the cathode 27 in and out of the vacuum chamber 20A. Accordingly, the exchange between the workpieces before and after the coating can be easily performed.

Also, even if the cathode 27 is consumed, the exchange thereof is made easy, and further, the exchange to the cathode 27 of a kind being necessary for the coating on the workpieces 32 is also made easy. Further, the surface of the cathode 27 can be easily cleaned. Still further, by previously preparing a plurality of the movable carriers 25, it is possible to change the cathode 27 for each batch.

Figure 2:
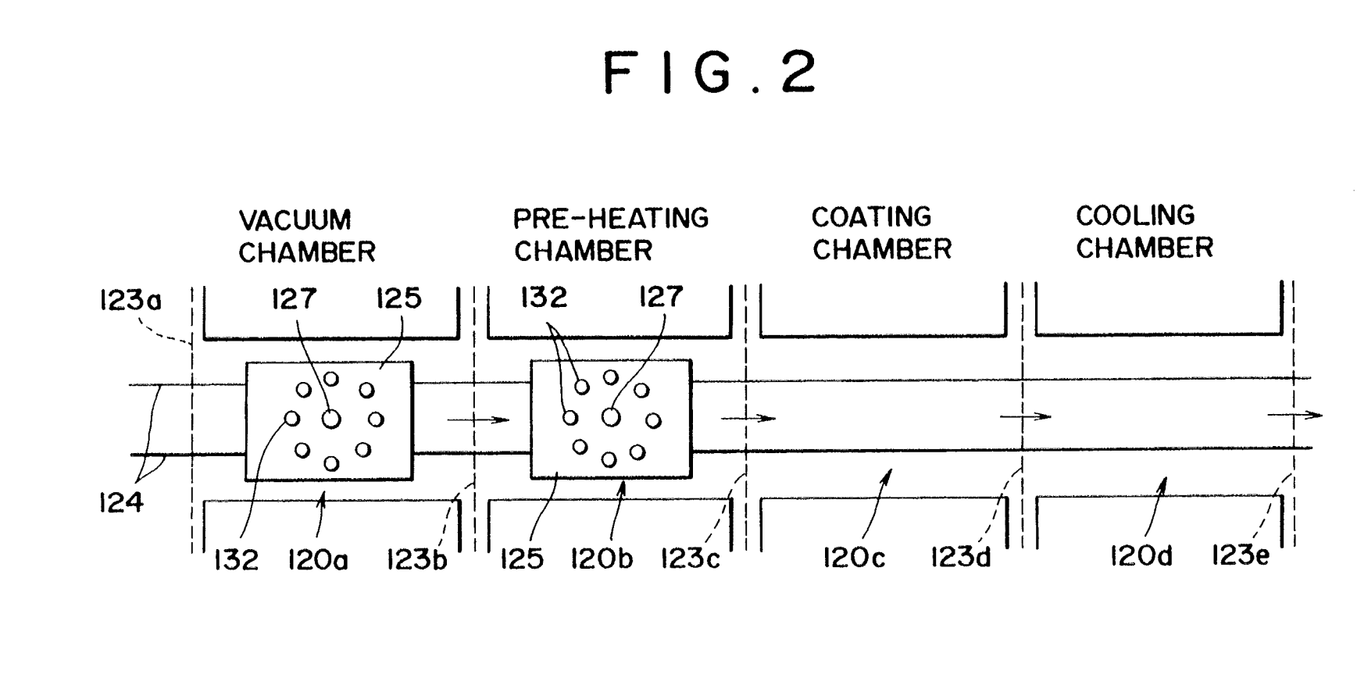
FIG. 2 is a schematic plan view showing a second embodiment of the present invention.

FIG. 2 shows a second embodiment of the present invention, which is of an inline type system while the first embodiment is of a batch type system. As shown in FIG. 2, a vacuum chamber 120a, pre-heating chamber 120b, coating chamber 120c and cooling chamber 120d are provided along rails 124 in this order. Further, doors 123a to 123e for opening/closing opening portions formed among respective chambers 120a and 120d and at both ends. In this system, first, the door 123a is opened to open the opening portion of the vacuum chamber 120a, and a movable carrier 125 mounting a cathode 127 and workpieces 132 is moved in the vacuum chamber 120a. Then, the door 123a is closed, and the vacuum evacuation treatment is performed. After that, the door 123b is opened to open the opening portion between the vacuum chamber 120a and the pre-heating chamber 123b, and the movable carrier 125 is moved in the pre-heating chamber 120b through the opening portion, after which the door 123b is closed and the pre-heating treatment is performed. After that, in the same manner as described, the sequential treatment is performed, and lastly the movable carrier 125 is removed to the outside through the opening portion of the door portion 123e.

With this system, since the sequential treatment is performed by moving the movable carrier 125 mounting the cathode 127 and the workpieces 132 among respective chambers, it is possible to smoothly carry the workpieces 132, and hence to obtain a high working efficiency.

Figure 3:
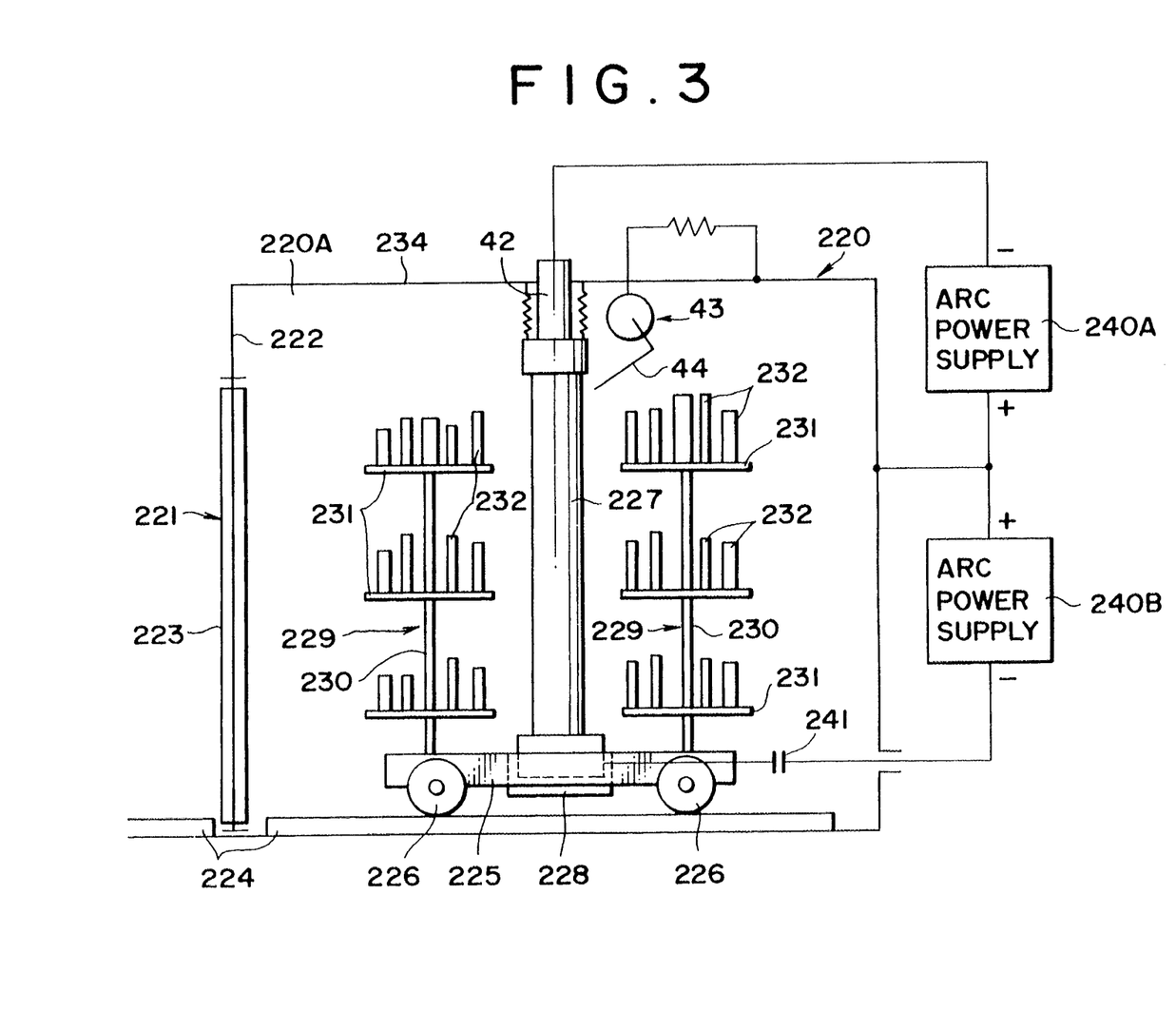
FIG. 3 is a schematic view showing the construction of a third embodiment of the present invention.

FIG. 3 shows a third embodiment of the present invention having the following construction: An opening portion 221 of a front wall 222 is made to be freely opened/closed by a door 223, and a vacuum vessel 220 is made to be an anode by itself. A negative terminal bar 42 is provided on a ceiling portion 234 side of the vacuum vessel 220 through an insulating material. When a movable carrier 225 having wheels 226 rolling on rails 224 is moved in a vacuum chamber 220A, a cathode 227 erected on the carrier 225 through an insulating material 228 is electrically connected to the negative terminal bar 42. Two arc power supplies 240A and 240B are connected to a contact 241, and between the negative terminal bar 42 and the vacuum chamber 220A, respectively. Also, ignition electrode 44 of an igniter 43 is provided on the ceiling portion 234 side of the vessel 220 within the vacuum chamber 220A.

In this third embodiment, as an arc discharge is generated between the ignition electrode 44 and the cathode 227, and the discharge is subsequently generated between the vacuum vessel 220 and the cathode 227. In the above, since the reversed currents are applied to the cathode 227 from the two arc power supplies 240A and 240B, the magnetic fields generated by the arc currents are cancelled to each other, which brings such a state that the magnetic field is not generated apparently.

Accordingly, the arc spot is not affected by the magnetic field, and is moved at random over the whole length of the cathode 227, which brings the state that the arc discharge is continuously generated over the whole length of the cathode 227.

Therefore, the cathode 227 is equally evaporated over the whole length, thus eliminating the local consumption, which makes it possible to perform a specified coating on the workpieces 232 mounted on each rotary table 229 composed of a rotary shaft 230 and receiving plates 231.

Figure 4:
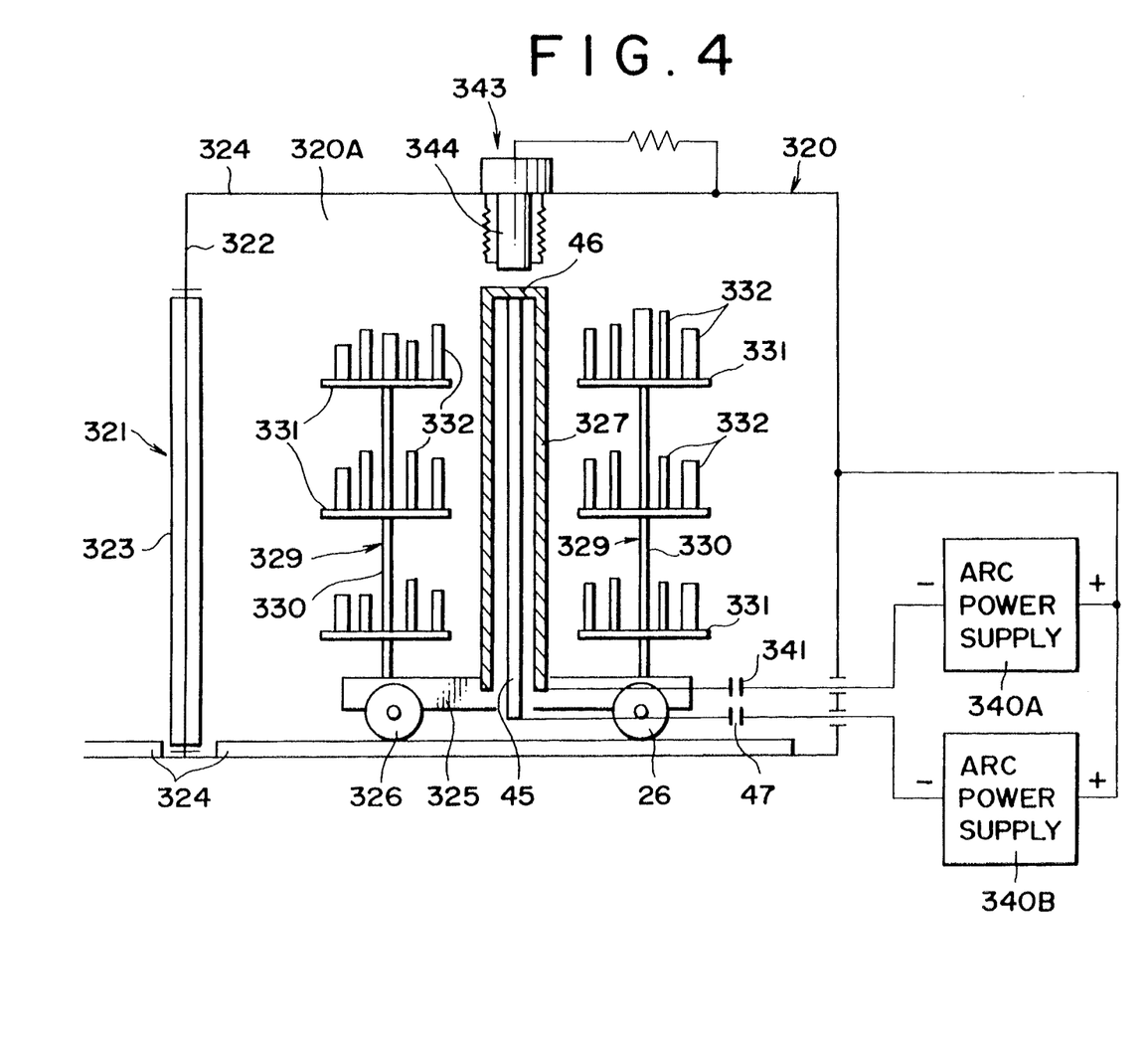
FIG. 4 is a schematic view showing the construction of a fourth embodiment of the present invention.

FIG. 4 shows a fourth embodiment of the present invention, wherein a movable carrier 325, which is movable in and out of a chamber 320A of a vacuum vessel 320 having a door 323 for freely opening/closing an opening portion 321 of a front wall 322, includes wheels 326 rolling on rails 324.

A cathode 327 is mounted on the movable carrier 325, and workpieces 332 are mounted on each rotary table 329 composed of a rotary shaft 330 and receiving plates 331. The cathode 327 and workpieces 332 are freely carried in and out of the vacuum chamber 320A through the opening portion 321 by the movable carrier 325 just as in the first, second and third embodiments.

The cathode 327 in the fourth embodiment is formed in an inverted bottoming cylindrical shape, and is connected at the lower end to a negative terminal side of one arc power supply 340A through a contact 341.

Further, a negative terminal bar 45 is inserted in the cathode 327 so as to be approximately concentric thereto. The negative terminal bar 45 is electrically connected to an upper side bottom portion 46 of the cathode 327, and is connected at the lower end side to the negative terminal side of the other arc power supply 340B through a contact Further, the positive terminal sides of the two arc power supplies 340A and 340B are connected to the vacuum vessel 320, and thus the vessel 320 is made to the anode by itself An ignition electrode 344 of an igniter 343 is provided on a ceiling portion 324 of the vessel 320.

Even in the fourth embodiment, just as the third embodiment described above, it is possible to generate the arc discharge over the whole length of the cathode 327.

Figure 5:
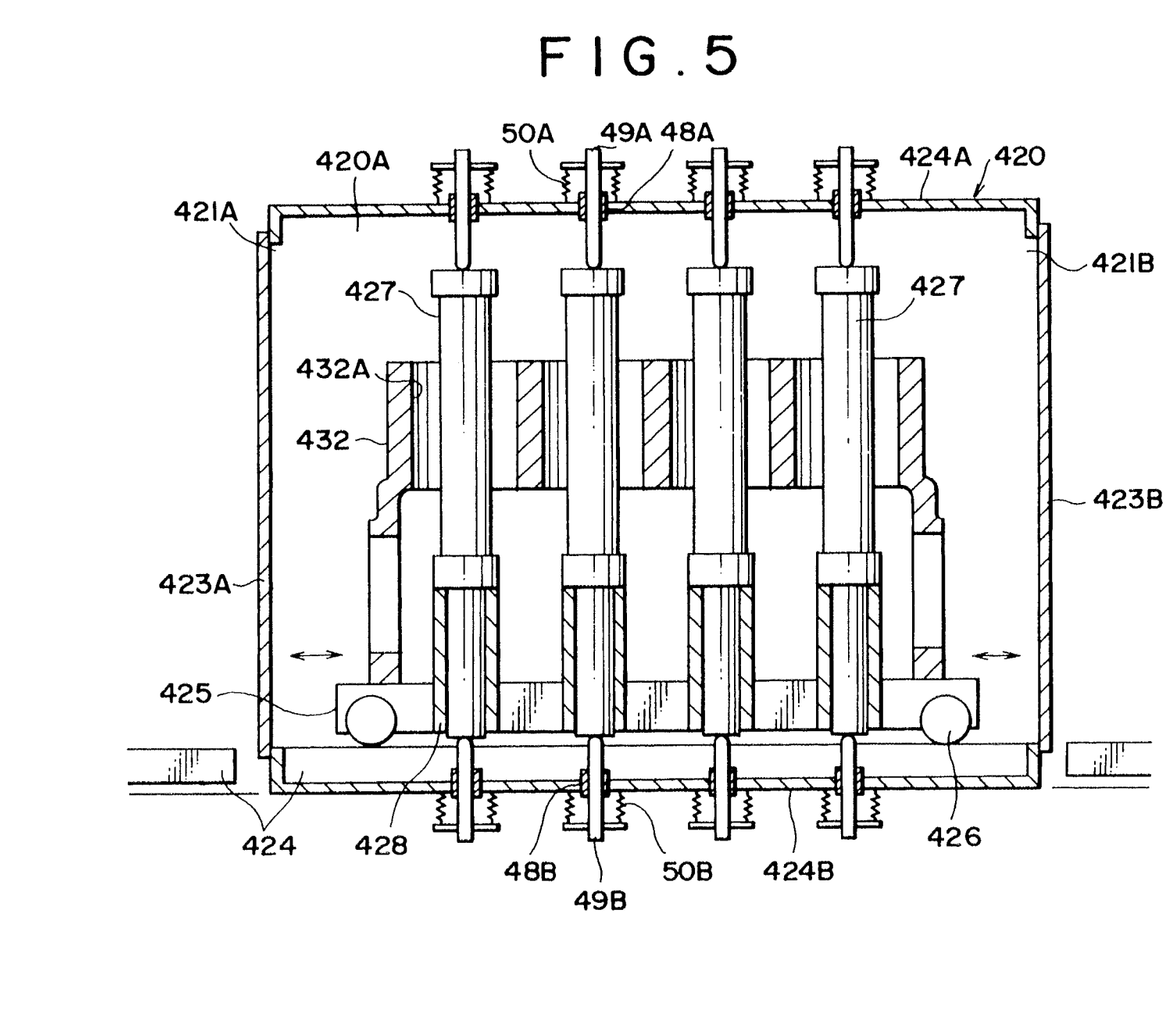
FIG. 5 is a schematic front view showing the construction of a fifth embodiment of the present invention.
Figure 6:
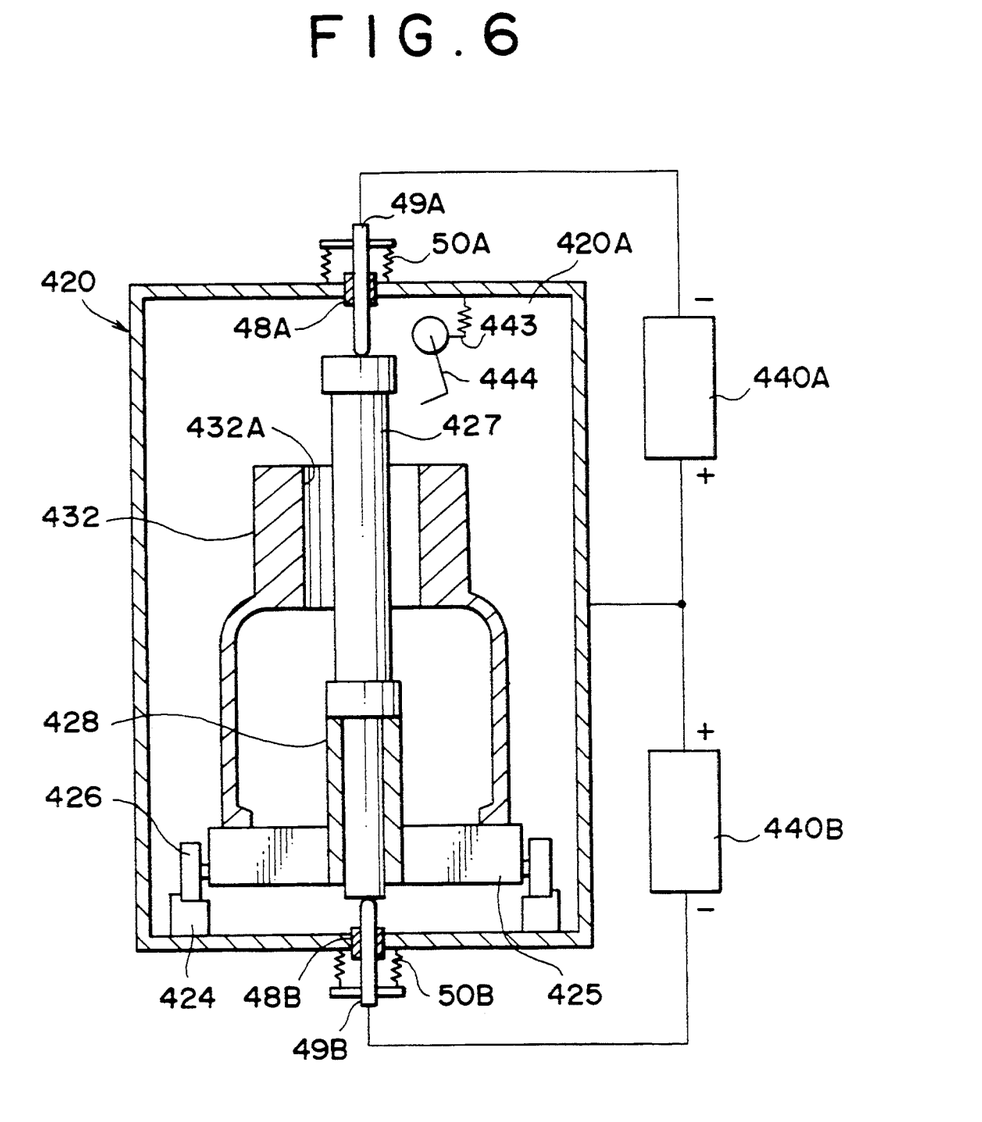
FIG. 6 is a schematic side view showing the construction of the fifth embodiment of the present invention.

FIGS. 5 and 6 show a fifth embodiment, wherein one workpiece 432 having a plurality of portions to be coated is mounted on a movable carrier 425, and a plurality of cathodes 427 are provided on the movable carrier 425.

In FIGS. 5 and 6, a vacuum vessel 420 defining a vacuum chamber 420A has respective opening portions 421A and 421B on the front wall and the back wall, which are freely opened/closed by means of doors 423A and 423B, respectively.

Rails 424 are laid through respective opening portions 421A and 421B inside and outside the vacuum vessel 420A. Thus, by running the movable carrier 425 having wheels 426 rolling the rails 424 along the rails 424, the movable carrier 425 is freely moved in and out of the vacuum vessel 420A through the opening portions 421A and 421B.

The workpiece 432 exemplified by a four cylinder engine block is mounted, and four pieces of the cathodes 427 are removably erected on the carrier 425 through electrically insulating bodies 428 so as to be approximately concentric to cylinder bores 432A as the portions to be coated, respectively.

Negative terminal bars 49A and 49B are vertically slidably held on a ceiling portion 424A and floor plate portion 424B of the vacuum vessel 420 through the electrically insulating bodies 48A and 48B and are sealed by bellows 50A and 50B, respectively.

Two arc power supplies 440A and 440B are provided outside the vacuum vessel 420, wherein the positive terminal sides thereof are connected to the vacuum vessel 420 to function the vessel itself as an anode, and the negative terminal sides thereof are electrically connected to the negative terminal bars 49A and 49B, respectively. Also, an ignition electrode 444 of an igniter 443 is provided on a ceiling portion 424A in the vacuum chamber 420A.

Even in the fifth embodiment, in the state that the movable carrier 425 is removed outside the vacuum chamber 420A, the workpiece 432 and the cathodes 427 are built-in and mounted on the carrier 425, which are moved in the vacuum chamber 420A in such a state. Then, the upper and lower end surfaces of the cathodes 427 are electrically connected to the negative terminal bars 49A and 49B, respectively. After that, the vacuum chamber 420A is degassed by a vacuum pump (not shown), and a process gas is introduced as needed. An arc discharge is then generated the ignition electrode 444 and each cathode 427, and subsequently, the arc discharge is generated between the vacuum chamber 420A and each cathode 427. Thus, each cathode is evaporated and each cylinder bore 432A is coated with the component of the cathode 427 or the compound thereof.

In addition, in any of the embodiments described above, the cathode is approximately vertically erected on the carrier.

However, the cathode may be provided in the horizontal state or in the tilting state. Further, the cathode provided to be vertically inverted may be sufficiently embodied.

Also, the movable carrier may be of a self-running type or of a pulling type. The rails may be formed in the so-called rack rails having wheels each being composed of a rack pinion.

In place of the wheels, there may be used shoes. Further, the door for opening/closing the opening portion may be either a slide type or a biparting type, that is, may be any type being capable of certainly performing the sealing when the opening portion is closed.

The embodiments described above are only illustrative and not restrictive, and the present invention may be variously embodied without departing the scope and the spirit of the invention. The scope of the present invention is defined by the appended claims rather than by the details of the specification, and all changes and modifications covered in the claims fall within the scope of the present invention.

I claim:

1. An arc ion plating system for forming thin film on the surface of a workpiece, comprising:
   a vacuum chamber;
   a door provided on said vacuum chamber for opening and closing a passage between outside of said vacuum chamber and inside of said vacuum chamber;
   an opening/closing means for opening/closing said door;

a moving means for moving a platform in and out of said vacuum chamber through said door, said platform being movable in and out of said vacuum chamber through said door;

means for mounting workpiece on said platform;

means for mounting a cathode on said platform so that said cathode is electrically insulated from a conducting portion of said platform; and means for evaporating part of said cathode and depositing some of the evaporated part onto said workpiece.

2. An arc ion plating system according to claim 1, further comprising:

means for rotating said platform, comprising a rotary shaft and a receiving plate.

3. An arc ion plating system according to claim 1, wherein said moving means comprises a movable carrier.

4. An arc ion plating system according to claim 1, further comprising:

an anode provided in said vacuum chamber.

5. An arc ion plating system according to claim 4, further comprising:

an anode vertical sliding means for vertically sliding said anode, said anode vertical sliding means being mounted to a ceiling portion of said vacuum chamber, thereby providing means for intermittently contacting said cathode with said anode.

6. An arc ion plating system according to claim 1, wherein said anode comprises walls of said vacuum chamber.

7. An arc ion plating system according to claim 6, further comprising:

a first arc power supply having a positive terminal that is electrically connected to said vacuum chamber and a negative terminal that is electrically connected to said cathode when said cathode is in a first position that is inside said vacuum chamber;

a second arc power supply having a positive terminal that is electrically connected to said vacuum chamber; and a negative terminal bar that is electrically connected to a negative terminal of said second power supply, is provided on said ceiling portion of said vacuum chamber, and is for electrical connection to said anode for forming thin film on said workpiece; and an igniter that is electrically connected to said vacuum chamber for generating an arc discharge between said cathode and the same.

8. An arc ion plating system according to claim 6, wherein said cathode is formed in a cylindrical shape with the upper opening being blocked by an upper side bottom portion of said cathode.

9. An arc ion plating system according to claim 8, further comprising:

a first arc power supply having a positive terminal electrically connected to said vacuum chamber, and a negative terminal electrically connected to said cathode;

a second arc power supply having a positive terminal electrically connected to said vacuum chamber;

a negative terminal bar electrically connected to said negative terminal of said second arc power supply, and which is inserted in said cylindrical cathode to be electrically connected to the upper side bottom portion of said cathode; and an igniter electrically connected to said vacuum chamber for generating an arc discharge between said cathode and the same.

10. An arc ion plating system according to claim 1, wherein a plurality of cathodes are mounted on said moving means.

11. An arc ion plating system according to claim 10, wherein said workpiece comprises an engine block, and a plurality of said cathodes are inserted in cylinder bores of said engine block.

12. An arc ion plating system according to claim 10, wherein said moving means comprises a movable carrier.

13. An ion plating system for coating the surfaces of a workpiece using the component of a cathode, comprising:

a vacuum chamber having doors at two ends of the vacuum chamber, means for carrying a workpiece into said vacuum chamber through one of said doors, means for evacuating said vacuum chamber;

a pre-heating chamber having first and second doors at two ends of the pre-heating chamber, the first door of the pre-heating chamber also being one of the doors of said vacuum chamber;

means for carrying said workpiece into said pre-heating chamber through one of the doors of said pre-heating chamber;

means for heating the pre-heating chamber;

a coating chamber having doors at two ends of the coating chamber, one of which is also the second door of said pre-heating chamber;

means for carrying said workpiece into said coating chamber through one of the doors of said coating chambers;

means for coating the workpiece in said coating chamber;

a cooling chamber having doors at two ends of the cooling chamber, one of which is also one of the doors of said coating chamber;

means for carrying said workpiece into said cooling chamber through one of the doors of said cooling chamber, said workpiece being cooled in said cooling chamber;

means for carrying the workpiece out of said cooling chamber through the other one of the doors of said cooling chamber;

opening/closing means for opening and closing the respective doors of said system; and a moving means that is movable between inside of said chambers and outside of said chambers through said respective doors, comprising means for mounting said workpiece and said cathode.

14. An arc ion plating system, comprising:

a door for opening/closing an opening portion of a vacuum chamber:

a movable carrier movable in and out of said vacuum chamber through said opening portion; and a cathode and a rotary table for mounting a workpiece, which are provided on said movable carrier.

15. An arc ion plating system according to claim 14, wherein an anode is provided on said vacuum chamber.

* * * * *